United States Patent
Hah et al.

(10) Patent No.: US 7,855,038 B2
(45) Date of Patent: *Dec. 21, 2010

(54) MASK PATTERNS FOR SEMICONDUCTOR DEVICE FABRICATION AND RELATED METHODS AND STRUCTURES

(75) Inventors: Jung-hwan Hah, Gyeonggi-do (KR);
Hyun-woo Kim, Gyeonggi-do (KR);
Mitsuhiro Hata, Gyeonggi-do (KR);
Sang-gyun Woo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 134 days.

This patent is subject to a terminal disclaimer.

(21) Appl. No.: 12/042,625

(22) Filed: Mar. 5, 2008

(65) Prior Publication Data

US 2008/0176152 A1    Jul. 24, 2008

Related U.S. Application Data

(62) Division of application No. 11/232,703, filed on Sep. 22, 2005, now Pat. No. 7,361,609.

(30) Foreign Application Priority Data

Sep. 23, 2004    (KR)    .................. 10-2004-0076349

(51) Int. Cl.
*G03F 9/00*    (2006.01)
(52) U.S. Cl. .................. 430/14; 430/166; 430/270.1; 430/296; 430/311; 430/322
(58) Field of Classification Search .................. 430/14, 430/270.1, 311, 322, 296, 166
See application file for complete search history.

(56) References Cited

U.S. PATENT DOCUMENTS

| 5,057,396 | A | 10/1991 | Tanaka et al. |
|---|---|---|---|
| 5,200,051 | A | 4/1993 | Cozzette et al. |
| 6,103,788 | A | 8/2000 | Harui et al. |
| 6,110,637 | A | 8/2000 | Sezi et al. |
| 6,171,755 | B1 | 1/2001 | Elian et al. |
| 6,319,853 | B1 | 11/2001 | Ishibashi et al. |
| 6,379,869 | B1 | 4/2002 | Schroeder et al. |
| 6,806,027 | B2 | 10/2004 | Hohle et al. |
| 2002/0064958 | A1 | 5/2002 | Takeuchi |
| 2003/0082488 | A1 | 5/2003 | Rottstegge et al. |
| 2003/0207521 | A1 | 11/2003 | Tanaka et al. |
| 2004/0009436 | A1 | 1/2004 | Lee et al. |
| 2004/0018450 | A1 | 1/2004 | Fang et al. |
| 2006/0046205 | A1 | 3/2006 | Hah et al. |
| 2006/0084277 | A1 | 4/2006 | Nakashima et al. |

FOREIGN PATENT DOCUMENTS

| CN | 1488995 | 4/2001 |
|---|---|---|
| CN | 1407116 | 4/2003 |
| JP | 2004-37570 A | 2/2004 |
| JP | 2004-093832 | 3/2004 |
| KR | 10-1998-0011721 | 4/1998 |
| KR | 1020000009374 | 2/2000 |
| KR | 10-2001-0037049 A | 5/2001 |
| KR | 10-2003-0049198 A | 6/2003 |
| KR | 102004005329 | 1/2004 |
| KR | 10-2004-0015955 A | 2/2004 |
| KR | 2004-0015955 | 2/2004 |
| KR | 1020040020006 | 3/2004 |

OTHER PUBLICATIONS

Korean Intellectual Property Office "Notice to Submit Response" for Korean Appl. No. 10-2004-0076349, issued on Mar. 28, 2006.

*Primary Examiner*—John S Chu
(74) *Attorney, Agent, or Firm*—Myers Bigel Sibley & Sajovec, P.A.

(57) ABSTRACT

Methods of forming an integrated circuit device may include forming a resist pattern on a layer of an integrated circuit device with portions of the layer being exposed through openings of the resist pattern. An organic-inorganic hybrid siloxane network film may be formed on the resist pattern. Portions of the layer exposed through the resist pattern and the organic-inorganic hybrid siloxane network film may then be removed. Related structures are also discussed.

7 Claims, 3 Drawing Sheets

MASK PATTERNS FOR SEMICONDUCTOR DEVICE FABRICATION AND RELATED METHODS AND STRUCTURES

RELATED APPLICATION

The present application claims the benefit of priority as a divisional of U.S. application Ser. No. 11/232,703 filed Sep. 22, 2005, now U.S. Pat. No. 7,361,609 which claims the benefit of priority from Korean Patent Application No. 10-2004-0076349, filed on Sep. 23, 2004, in the Korean Intellectual Property Office. The disclosures of both of the above-referenced applications are incorporated herein in their entirety by reference.

FIELD OF THE INVENTION

The present invention relates to semiconductor device fabrication, and more particularly to mask patterns for semiconductor device fabrication and related methods and structures.

BACKGROUND

In a conventional patterning process for semiconductor device fabrication, a photoresist pattern may be formed on a film (for example, a silicon film, a dielectric film, or a conductive film) to be etched for pattern formation. The film may be etched using the photoresist pattern as an etching mask to form a desired pattern.

With increases in integration densities of semiconductor devices, smaller critical dimensions (CDs) and/or new lithography techniques may be needed to form fine patterns including contact holes having smaller opening sizes or spaces having smaller widths. For realization of such fine patterns, high-resolution photolithography and photoresist materials with resistance to dry etching may be needed. However, it may be difficult to simultaneously satisfy resolution and dry etching characteristics. To provide relatively high resolution and wide DOF (depth of focus), the thickness of a resist film may be reduced. A reduced resist film thickness, however, may deteriorate dry etching characteristics.

In this respect, various technologies have been suggested to reduce the above-described problem. For example, a chemical surface treatment of a photoresist pattern with a dry-etching resistant material has been proposed. In particular, silicon-containing compounds with resistance to dry etching have been studied.

For example, U.S. Pat. No. 6,110,637 discloses a technology of forming a fine pattern by crosslinking reaction between a photoresist with a carboxylic acid anhydride functional group and an aminosiloxane oligomer. This technology, however, may require a specific photoresist material capable of crosslinking with aminosiloxane and a separate organic solvent for removal of a non-crosslinked silicon-containing material.

U.S. Patent Publication No. 2004/0009436 A1 discloses a technology of coating a silicon-containing material layer on a resist pattern using a crosslinking reaction between a silicon-containing water-soluble polymer and the resist pattern. According to this technology, silicon content may be restricted, and thus, a sufficient resistance to dry etching may be difficult to obtain.

SUMMARY

According to some embodiments of the present invention, methods of forming an integrated circuit device may include forming a resist pattern on a layer of an integrated circuit device with portions of the layer being exposed through openings of the resist pattern. Moreover, an organic-inorganic hybrid siloxane network film may be formed on the resist pattern. Portions of the layer exposed through the resist pattern and the organic-inorganic hybrid siloxane network film may then be etched thereby patterning the layer.

Forming the organic-inorganic hybrid siloxane network film may include forming a siloxane oligomer on the resist pattern and on the portions of the layer exposed through the openings of the resist pattern, and inducing a sol-gel reaction at portions of the siloxane oligomer on the resist pattern. More particularly, the sol-gel reaction may be induced using acid from the resist pattern, and the acid may be diffused from the resist pattern to the siloxane oligomer by heating the resist pattern with the siloxane oligomer thereon to a temperature in the range of about 80 degrees C. to about 160 degrees C. After inducing the sol-gel reaction, unreacted portions of the siloxane oligomer may be removed, for example, using deionized water.

The siloxane oligomer may be formed by hydrolysis and condensation of a tetraalkoxysilane crosslinking agent and a trialkoxy-monoalkyl silane coupling agent. More particularly, the tetraalkoxysilane crosslinking agent may be selected from the group consisting of tetramethyl orthosilicate, tetraethyl orthosilicate, tetrapropyl orthosilicate, and/or tetrabutyl orthosilicate. The trialkoxy-monoalkyl silane coupling agent may be selected from the group consisting of aminopropyltrialkoxysilane, glycidoxypropyltrialkoxysilane, isocyanatopropyltriakoxysilane, and/or mercaptopropyltrialkoxysilane.

The resist pattern may be a pattern of a photoresist material. More particularly, the photoresist material may include a Novolak resin and a diazonaphthoquinone (DNQ) based compound, and/or the photoresist material may include a chemically amplified resist composition including a photoacid generator (PAG). Forming the resist pattern may include forming a continuous layer of a photosensitive resist material; exposing the continuous layer of the photosensitive resist material using at least one of a KrF excimer laser (248 nm), an ArF excimer laser (193 nm), and/or an $F_2$ excimer laser (157 nm); and developing the continuous layer of the photosensitive resist material.

The layer may include a layer of a material selected from the group consisting of a dielectric material, a conductive material, a semiconductor material, and/or a resist material. Moreover, exposed portions of the layer may be reduced after forming the organic-inorganic hybrid siloxane network film. In addition, the openings of the resist pattern may define a pattern of holes, and/or a pattern of lines and spaces.

According to some other embodiments of the present invention, a structure for patterning a layer of an integrated circuit device may include a resist pattern on the layer of the integrated circuit device with portions of the resist layer being exposed through openings of the resist pattern. In addition, an organic-inorganic hybrid siloxane network film may be provided on the resist pattern.

The siloxane network film may include a product of a reaction between a tetraalkoxysilane crosslinking agent and a trialkoxy-monoalkyl silane coupling agent. More particularly, the tetraalkoxysilane crosslinking agent may be selected from the group consisting of tetramethyl orthosilicate, tetraethyl orthosilicate, tetrapropyl orthosilicate, and/or tetrabutyl orthosilicate. The trialkoxy-monoalkyl silane coupling agent may be selected from the group consisting of aminopropytrialkoxysilane, glycidoxypropyltrialkoxysilane, isocyanatopropyltriakoxysilane, and/or mercaptopropyltrialkoxysilane.

The resist pattern may be a photoresist pattern. More particularly, the photoresist pattern may include a Novolak resin and a diazonaphthoquinone (DNQ) based compound, and/or the photoresist pattern may include a chemically amplified resist composition including a photo-acid generator (PAG). The resist pattern may include a photosensitive material sensitive to at least one of KrF excimer laser radiation (248 nm), a ArF excimer laser radiation (193 nm), and/or $F_2$ excimer laser radiation (157 nm).

The organic-inorganic hybrid siloxane network film may be on sidewalls of the resist pattern so that portions of the layer are exposed between portions of the siloxane network film on sidewalls of the resist pattern. Moreover, the openings of the resist pattern may define a pattern of holes, and/or the openings of the resist pattern may define a pattern of lines and spaces.

Some embodiments of the present invention may provide mask patterns for semiconductor device fabrication which can provide sufficient resistance to dry etching when forming relatively fine patterns above a wavelength limit of lithography.

Some embodiments of the present invention may also provide methods of forming mask patterns for semiconductor device fabrication which can be used to form relatively fine patterns with smaller feature sizes while maintaining a sufficient resistance to dry etching.

Some embodiments of the present invention may provide methods of fabricating semiconductor devices, which can provide relatively fine patterns above a wavelength limit of lithography while maintaining a sufficient resistance to dry etching.

According to some embodiments of the present invention, a mask pattern may be provided for semiconductor device fabrication. The mask pattern may include a resist pattern formed on a semiconductor substrate and an organic-inorganic hybrid siloxane network film formed on the resist pattern. The siloxane network film may be made of a reaction product resulting from a reaction between a tetraalkoxysilane crosslinking agent and a trialkoxy-monoalkyl silane coupling agent.

According to other embodiments of the present invention, a method may be provided for forming a mask pattern for semiconductor device fabrication. A resist pattern may be formed on an under layer covering a substrate with openings through which the under layer is exposed. An organic-inorganic hybrid siloxane network film may be formed on a surface of the resist pattern.

To form the siloxane network film, a siloxane oligomer may be obtained by hydrolysis and condensation of a tetraalkoxysilane crosslinking agent and a trialkoxy-monoalkyl silane coupling agent, and the siloxane oligomer may be coated on the surface of the resist pattern. Then, a sol-gel reaction of the siloxane oligomer may be induced on the surface of the resist pattern. The sol-gel reaction of the siloxane oligomer may be induced by an acid diffused from the resist pattern. To induce the sol-gel reaction of the siloxane oligomer, the resist pattern coated with the siloxane oligomer may be heated to diffuse the acid from the resist pattern toward the siloxane oligomer. After the siloxane network film is formed, an unreacted siloxane oligomer remaining around the siloxane network film may be removed with deionized water.

According to yet other embodiments of the present invention, a method of fabricating a semiconductor device may include forming an underlayer on a semiconductor substrate, and forming a resist pattern with openings through which the underlayer is exposed to a first width. An organic-inorganic hybrid siloxane network film may be selectively formed only on a surface of the resist pattern to expose the underlayer through the openings to a second width smaller than the first width. The underlayer may be etched using the resist pattern and the siloxane network film as an etching mask.

According to some embodiments of the present invention, an organic-inorganic hybrid siloxane network film may be a sol-gel reaction product induced by an acid of a resist pattern. The organic-inorganic hybrid siloxane network film may be formed on the resist pattern to obtain a mask pattern with microdimensional openings above a wavelength limit established by photolithography. Therefore, a vertical sidewall profile of the mask pattern can be maintained relatively unchanged. Furthermore, a residual reactant after formation of the siloxane network film may be removed using a deionized water rinse (a relatively simple and inexpensive process). Moreover, because an underlayer may be etched using the siloxane network film as the mask pattern, a sufficient resistance to dry etching may be provided.

DETAILED DESCRIPTION

Figure 1:
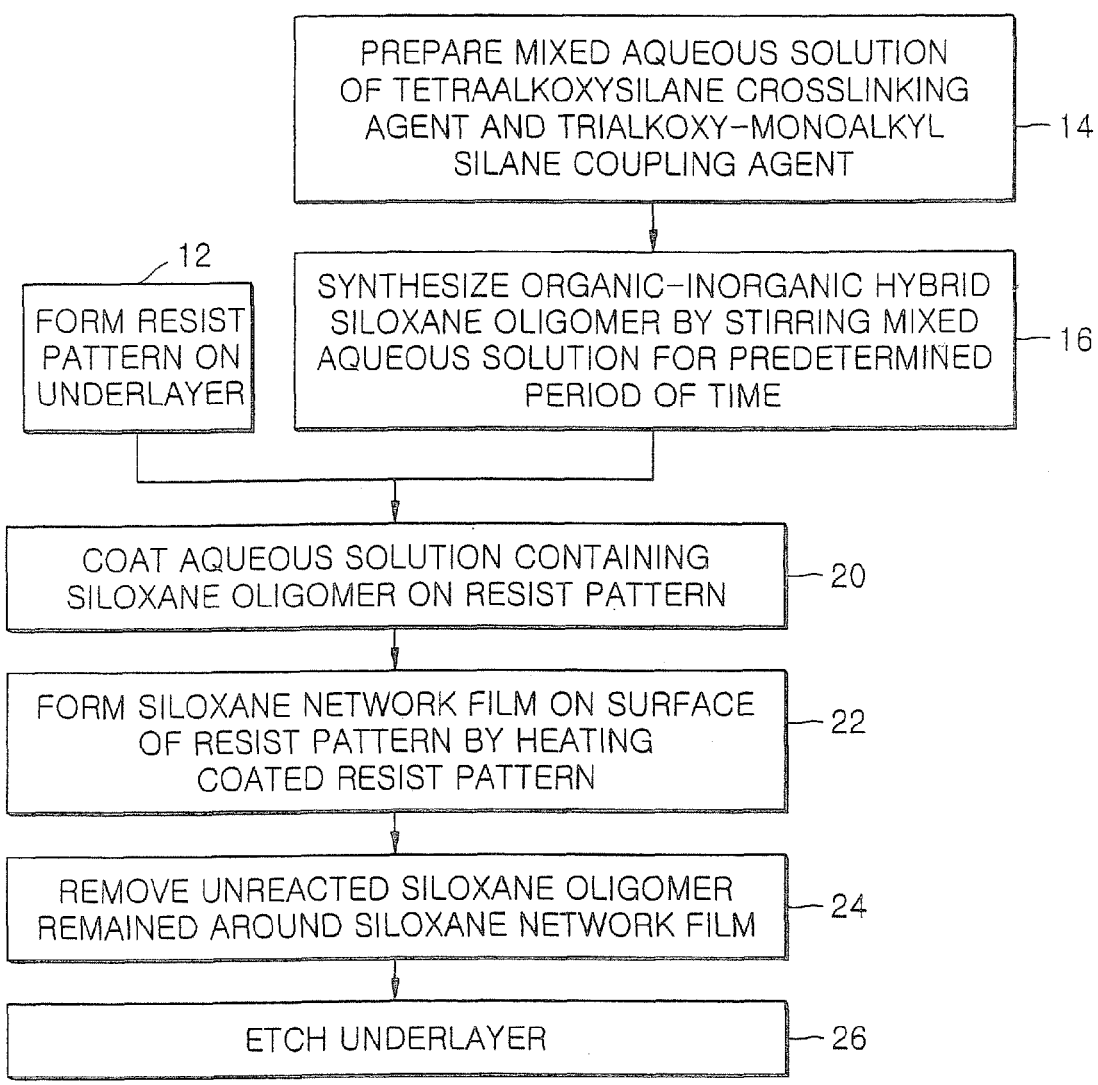
FIG. 1 is a flowchart illustrating methods of fabricating a semiconductor device according to embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, thickness and/or widths of layers, regions, and/or lines are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Embodiments of the invention are described herein with reference to cross-section illustrations that are schematic illustrations of idealized embodiments (and intermediate structures) of the invention. The thickness, lengths, and/or widths of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Moreover, vertically aligned layers may be undercut and/or overcut relative to one another due to variations in etch selectivity when etching multiple self-aligned layers using a single photolighographic or other mask. Thus, the regions illustrated in the figures are schematic in nature and their shapes are not intended to illustrate the actual shape of a region of a device and are not intended to limit the scope of the invention.

Furthermore, relative terms, such as beneath, over, under, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Methods of fabricating a semiconductor device according to embodiments of the present invention will now be described with reference to the flowchart of FIG. 1.

At block 12, an underlayer to be etched may first be formed on a semiconductor substrate. The underlayer may be a layer of any film material to be patterned. For example, the underlayer may be a dielectric film (such as a silicon film, an oxide film, a nitride film, and/or an oxide-nitride film), and/or a conductive film. When forming contact holes in the underlayer, the underlayer may be a dielectric film. To perform a patterning process using bi-layer resist (BLR) technology, a bottom resist film may be formed as the underlayer. In addition, to perform a patterning process using multi-layer resist (MLR) technology, the underlayer may include the bottom resist film and an interlayer oxide film.

Next, a resist film may be formed on the underlayer. The resist film may be subjected to exposure and development using conventional photolithography operations to provide a resist pattern with openings through which the underlayer is exposed to a predetermined width.

In forming the resist pattern, an acid generated in the resist film during the exposure may be diffused by a post-exposure bake process. When forming a positive resist film, the diffused acid may cause a deprotection reaction by which protecting groups are removed from protected polymers in exposed areas of the resist film, thereby selectively developing the exposed areas. When forming a negative resist film, the diffused acid may cause a polymer crosslinking reaction in exposed areas of the resist film, thereby selectively developing unexposed areas. During the post-exposure bake process, a small amount of an acid may remain at boundaries between the exposed areas and the unexposed areas of the resist film. This phenomenon may take place in all resists used in the pertinent art and/or that are commercially available regardless of components of the resists or type of exposure tool.

At block 14, a mixed aqueous solution of a tetraalkoxysilane crosslinking agent and a trialkoxy-monoalkyl silane coupling agent may be prepared. Here, the tetraalkoxysilane crosslinking agent and the trialkoxy-monoalkyl silane coupling agent may each be used in an amount of about 0.1 wt % to about 50 wt %, and more particularly in an amount of about 1 wt % to about 10 wt %, based on the total weight of the mixed aqueous solution.

The tetraalkoxysilane crosslinking agent that can be used herein may be represented by the following formula 1:

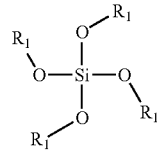

[Formula 1]

wherein each $R_1$ may be an alkyl group, and more particularly, a methyl group, an ethyl group, a propyl group, and/or a butyl group. Examples of the tetraalkoxysilane crosslinking agent that can be used herein include tetramethyl orthosilicate, tetraethyl orthosilicate, tetrapropyl orthosilicate, and/or tetrabutyl orthosilicate.

Trialkoxy-monoalkyl silane coupling agents that can be used herein may be selected from one or more compounds represented by the following formulae 2 through 5:

[Formula 2]

[Formula 3]

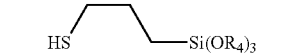

[Formula 4]

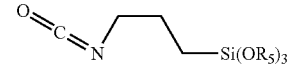

[Formula 5]

wherein each of $R_2$, $R_3$, $R_4$, and $R_5$ is an alkyl group, such as a methyl group, an ethyl group, a propyl group, and/or a butyl group. Examples of trialkoxy-monoalkyl silane coupling agents that can be used herein may include aminopropytrialkoxysilane, glycidoxypropyltrialkoxysilane, isocyanatopropyltrialkoxysilane, and/or mercaptopropyltrialkoxysilane. More particularly, the trialkoxy-monoalkyl silane coupling agent may include aminopropytrimethoxysilane, aminopropytriethoxysilane, glycidoxypropyltrimethoxysilane, glycidoxypropyltriethoxysilane, isocyanatopropyltrimethoxysilane, isocyanatopropyltriethoxysilane, mercaptopropyltrimethoxysilane, and/or mercaptopropyltriethoxysilane.

At block 16, the mixed aqueous solution prepared according to block 14 may be stirred for a predetermined period of time, and may be filtered to provide a siloxane oligomer. The siloxane oligomer may have an organic-inorganic hybrid structure including an organic moiety serving as a spacer in a molecular structure of the oligomer.

At block 20, an aqueous solution including the siloxane oligomer prepared at block 16 may be coated on the resist pattern formed at block 12. For example, spin coating may be used to coat the siloxane oligomer.

At block 22, the coated resist pattern may be heated at a temperature in the range of about 80° C. to about 160° C. During heating, an acid of the resist pattern may be diffused toward the aqueous solution including the siloxane oligomer which is present around the resist pattern, and the diffused acid may induce a sol-gel reaction of the siloxane oligomer at a surface of the resist pattern. As a result, an organic-inorganic hybrid siloxane network film may be formed on the surface of the resist pattern. As the heating temperature of the resist pattern increases, a diffusion distance of the acid of the resist pattern may increase, thereby increasing a thickness of the siloxane network film formed on the resist pattern.

At block 24, unreacted siloxane oligomer remaining around the siloxane network film may be removed by cleaning with deionized water. At block 26, the underlayer may be etched using the resist pattern and the siloxane network film on the resist pattern as an etching mask. As a result, a relatively fine pattern above a wavelength limit of lithography may be provided.

Figure 2A:
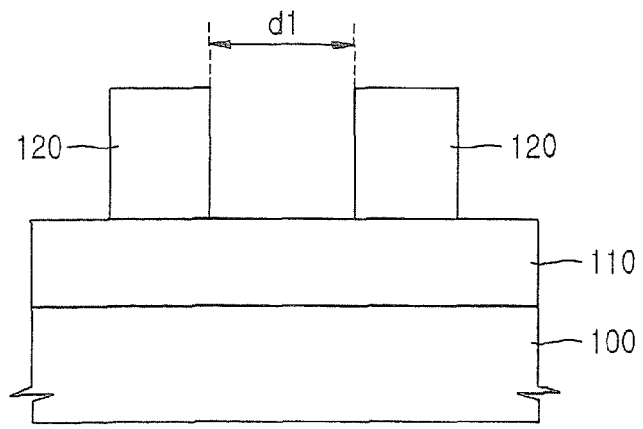
FIGS. 2A through 2F are cross-sectional views illustrating methods of fabricating semiconductor devices according to embodiments of the present invention.

FIGS. 2A through 2F are cross-sectional views illustrating steps of fabricating semiconductor devices according to embodiments of the present invention. Referring to FIG. 2A, an underlayer 110 may be formed on a semiconductor substrate 100 to be etched to form a predetermined pattern, such as a pattern of contact holes and/or trenches. For example, the underlayer 110 may be a dielectric film, a conductive film, and/or a semiconductive film. More particularly, the underlayer 110 may be etched to form a pattern therein such as a pattern of contact holes and/or trenches.

A resist pattern 120 may then be formed on the underlayer 110. The photo resist pattern 120 may be formed with openings through which portions of an upper surface of the underlayer 110 are exposed. Exposed portions of the underlayer 110 and/or openings in the photoresist pattern 120 may have a first width d1. The photo resist pattern 120 may be formed with a plurality of openings defining a hole pattern and/or a plurality of lines defining a line and space pattern. When the resist pattern 120 is formed with a plurality of lines, the first width d1 may correspond to a width of each space between the lines.

For example, the resist pattern 120 may be made of a material including a Novolak resin and a diazonaphthoquinone (DNQ)-based compound and/or including a chemically amplified resist composition including a photo-acid generator (PAG). For example, the resist pattern 120 may be formed using a resist composition for g-line exposure, a resist composition for i-line exposure, a resist composition for KrF excimer laser (248 nm) exposure, a resist composition for ArF excimer laser (193 nm) exposure, a resist composition for $F_2$ excimer laser (157 nm) exposure, and/or a resist composition for e-beam exposure. Moreover, the resist pattern 120 may be formed using a positive-type resist composition or a negative-type resist composition.

Figure 2B:
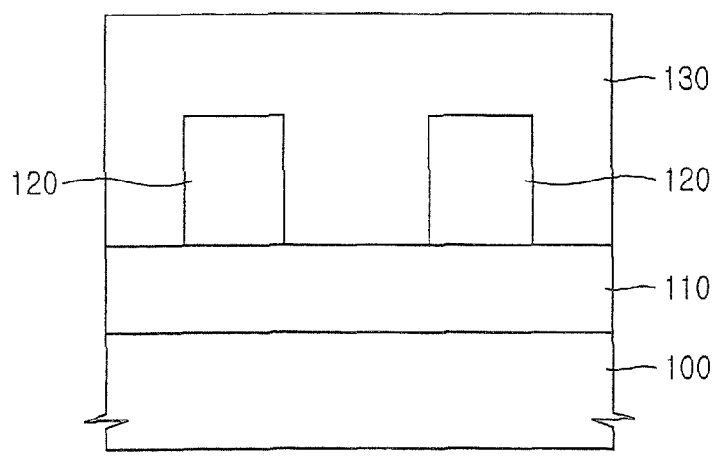

Referring to FIG. 2B, as discussed above with reference to block 20 of FIG. 1, an aqueous solution 130 including a siloxane oligomer (synthesized in a same manner as discussed with respect to blocks 14 and 16 of FIG. 1) may be coated on the resist pattern 120. The aqueous solution 130 may be spin-coated on the resist pattern 120 while rotating the semiconductor substrate 100 at a rate in the range of about 50 rpm to about 3,000 rpm for about 10 seconds to about 90 seconds.

Figure 2C:
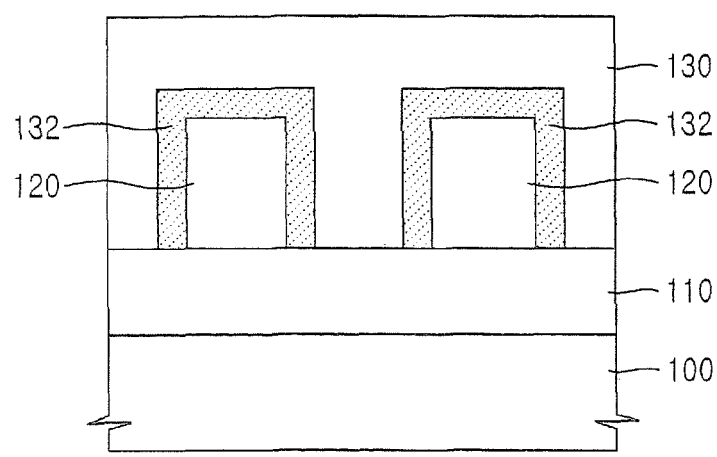

Referring to FIG. 2C, as discussed above with reference to block 22 of FIG. 1, the semiconductor substrate 100 may be heated at a temperature in the range of about 80° C. to about 160° C. (with the aqueous solution 130 in contact with a surface of the resist pattern 120) to form a siloxane network film 132 on the surface of the resist pattern 120. The siloxane network film 132 thus formed may be water-insoluble. The resist pattern 120 and the siloxane network film 132 may provide a mask pattern to be used as an etching mask when etching the underlayer 110.

Figure 2D:
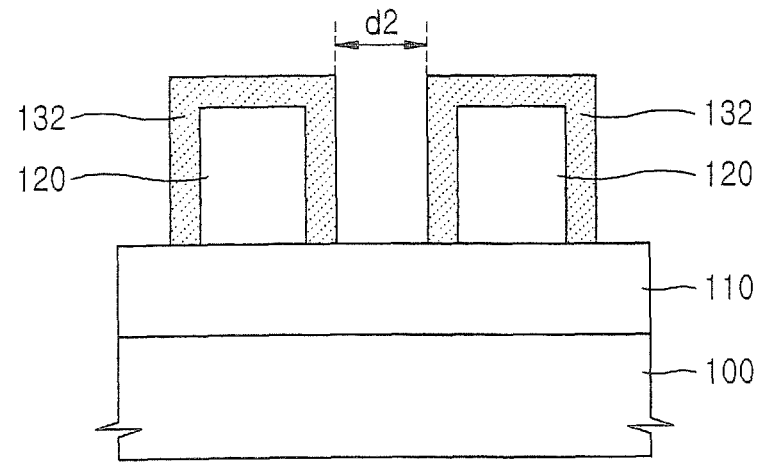

Referring to FIG. 2D, portions of the aqueous solution 130 including unreacted siloxane oligomer remaining around the siloxane network film 132 may be removed using deionized water. Because the aqueous solution 130 is water-soluble, it may be removed by rinsing with deionized water. As a result, the underlayer 110 may be exposed to a second width d2 that is less than the first width d1 through the openings of the etching mask including resist pattern 120 and siloxane network film 132. That is, an exposed area of the underlayer 110 may be reduced by the siloxane network film 132 formed on the surface of the resist pattern 120.

Figure 2E:
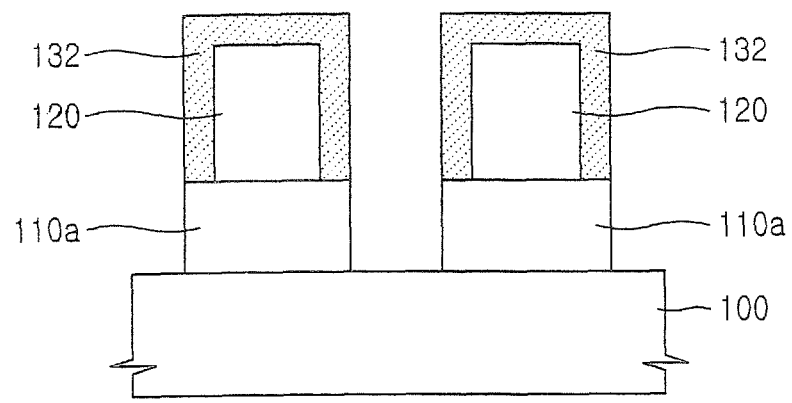
Figure 2F:
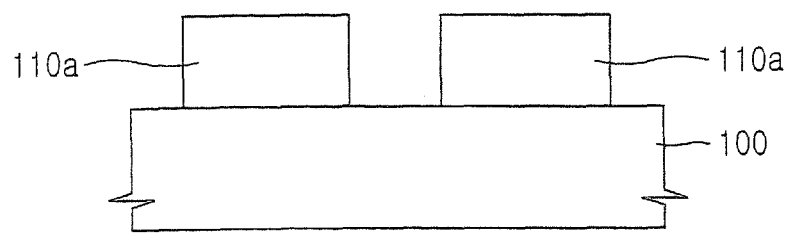

Referring to FIG. 2E, the underlayer 110 may be dry-etched using the resist pattern 120 and the siloxane network film 132 as an etching mask to form an underlayer pattern 110a. Referring to FIG. 2F, the mask pattern including the resist pattern 120 and the siloxane network film 132 may be removed.

Hereinafter, illustrative examples of mask patterns formed according to embodiments of the present invention will be described. The present invention will be described more specifically by the following Examples. The Examples are provided only for purposes of illustration, and thus, the present invention is not limited to or by them.

EXAMPLE 1

Organic antireflective films (such as DUV-30, Nissan Chemical Industries, Ltd.) were formed to thicknesses of 36 nm on bare silicon wafers and photoresists (such as SAIL-G24c, ShinEtsu Chemical Co. Ltd.) were coated thereon to form resist films with thicknesses of 240 nm. The wafers, on which the resist films were formed, were subjected to soft baking. The films thus formed were classified into five sample groups. The sample groups were subjected to exposure with ArF (193 nm) stepper (ASML 1100) specified with numeric aperture (NA) of 0.75 (annular illumination: 0.85-0.55) and exposure light energy of 22 mJ/cm$^2$, 23 mJ/cm$^2$, 24 mJ/cm$^2$, 25 mJ/cm$^2$, and 26 mJ/cm$^2$, respectively. The sample groups were then subjected to post-exposure baking (PEB). The five sample groups were then developed with a 2.38 wt % tetramethylammonium hydroxide (TMAH) solution to form, on the wafers, resist patterns with openings defining hole patterns with CDs (critical dimensions) of 97.9 nm, 109.6 nm, 122.1 nm, 123.7 nm, and 126.6 nm, respectively.

A mixed aqueous solution of 14% glycidoxypropyltrimethoxysilane and 4% tetraethoxysilane was stirred for two days to induce hydrolysis and condensation to thereby form a siloxane oligomer. 10 ml of a siloxane oligomer-containing aqueous solution previously prepared by filtration with a 0.5 μm filter (manufactured by Whatman, U.S.A.) was spin-coated on the resist patterns at 500 rpm for 30 seconds. The wafers coated with the siloxane oligomer-containing aqueous solution were heated at 90° C. for 60 seconds and then rinsed with deionized water. As a result, siloxane network films were formed to uniform thicknesses on surfaces of the resist patterns covering the wafers. CDs of the openings of the resist patterns exposed by the siloxane network films were 95.8 nm, 99.9 nm, 101.0 nm, 116.4 nm, and 122.0 nm for the five sample groups, respectively. That is, the sample groups had uniform siloxane network films on surfaces of the resist patterns, whereby the CDs of the openings were reduced.

EXAMPLE 2

Siloxane network films for five sample groups were formed on resist patterns in the same manner as in Example 1 except that wafers coated with a siloxane oligomer-containing aqueous solution were heated at 110° C. for 60 seconds. CDs of the openings of the resist patterns exposed by the siloxane network films were 83.0 nm, 91.5 nm, 96.8 nm, 103.6 nm, and 111.7 nm for the five sample groups, respectively. In comparison with the results of Example 1, an increase of a heating temperature in this Example increased the thickness of the siloxane network films formed on surfaces of the resist patterns, so that the CDs of the openings were further reduced with increased temperatures.

According to embodiments to the present invention, an organic-inorganic hybrid siloxane network film (which is a sol-gel reaction product induced by an acid of a resist pattern) may be formed on the resist pattern to provide a mask pattern with microdimensional openings above a wavelength limit for photolithography. According to embodiments of the present invention, CDs of openings of a mask pattern can be reduced to a desired level since a sol-gel reaction for formation of the siloxane network film can be performed at a controlled heating temperature. In reducing CDs of the openings, the sol-gel reaction may occur at a surface of the resist pattern, and thus, the siloxane network film may be selectively formed only on the surface of the resist pattern. As a result, a vertical sidewall profile of the mask pattern can be maintained relatively unchanged. Furthermore, because a residual reactant after formation of the siloxane network film can be removed by deionized water, a relatively simple and inexpensive process may be provided. Moreover, because an underlayer is etched using the siloxane network film as the mask pattern, a sufficient resistance to dry etching may be provided.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A structure for patterning a layer of an integrated circuit device, the structure comprising:
a resist pattern on the layer of the integrated circuit device, wherein portions of the layer are exposed through openings of the resist pattern; and
an organic-inorganic hybrid siloxane network film on the resist pattern, wherein the siloxane network film comprises a product of a reaction between a tetraalkoxysilane crosslinking agent and a trialkoxy-monoalkyl silane coupling agent.

2. A structure according to claim 1 wherein the openings of the resist pattern define a pattern of holes.

3. A structure according to claim 1 wherein the tetraalkoxysilane crosslinking agent is selected from the group consisting of tetramethyl orthosilicate, tetraethyl orthosilicate, tetrapropyl orthosilicate, and/or tetrabutyl orthosilicate.

4. A structure according to claim 1 wherein the trialkoxy-monoalkyl silane coupling agent is selected from the group consisting of aminopropyltrialkoxysilane, glycidoxypropyltrialkoxysilane, isocyanatopropyltriakoxysilane, and/or mercaptopropyltrialkoxysilane.

5. A structure according to claim 1 wherein the organic-inorganic hybrid siloxane network film is on sidewalls of the resist pattern so that portions of the layer are exposed between portions of the siloxane network film on sidewalls of the resist pattern.

6. A structure according to claim 2 wherein the siloxane network film comprises a product of a reaction between a tetraalkoxysilane crosslinking agent and a trialkoxy-monoalkyl silane coupling agent.

7. A structure according to claim 1 wherein the openings of the resist pattern define a pattern of lines and spaces.

* * * * *